United States Patent [19]

Sato et al.

[11] Patent Number: 4,987,023
[45] Date of Patent: Jan. 22, 1991

[54] ORGANIC THIN-FILM DEVICE

[75] Inventors: Itsuko Sato, Tokyo; Katsuyuki Naito, Yokohama; Nobuhiro Genma, Yokohama; Makoto Azuma, Yokohama, all of Japan

[73] Assignee: Kabushiki Kaisha Toshiba, Kawasaki, Japan

[21] Appl. No.: 330,205

[22] Filed: Mar. 29, 1989

[30] Foreign Application Priority Data

Mar. 29, 1988 [JP] Japan ................................. 63-73305
Oct. 11, 1988 [JP] Japan ................................. 63-253742

[51] Int. Cl.$^5$ ..................... B32B 7/04; C09K 11/06; G11C 11/00
[52] U.S. Cl. ..................... 428/215; 428/420; 428/323; 428/702; 428/432; 350/355; 427/164; 427/402; 365/153
[58] Field of Search ..................... 428/215, 420, 323

[56] References Cited

U.S. PATENT DOCUMENTS 4,574,366 3/1986 Potember et al. ................. 365/153

FOREIGN PATENT DOCUMENTS 61-37862 2/1986 Japan .

OTHER PUBLICATIONS

Barraud et al., "Conducting Langmuir-Blodgett Films", Thin Solid Films, vol. 134, pp. 195-199 (1985).

Primary Examiner—P. C. Sluby
Attorney, Agent, or Firm—Foley & Lardner, Schwartz, Jeffery, Schwaab, Mack, Blumenthal & Evans

[57] ABSTRACT

An organic thin film device, including first and second organic thin films containing acceptor and doner molecules, respectively, stacked one on another, in which at least one of the first and second organic thin films contains a chemical species having a dipole moment $P_2$, and the second dipole moment $P_2$ and a dipole moment $P_1$ produced by charge transfer between the acceptor and doner molecules satisfy the following formula:

$$(P_1 \cdot P_2)|r|^2 - 3(P_1 \cdot r)(P_2 \cdot r) < 0$$

wherein r represents a positional relationship between $P_1$ and $P_2$. Also disclosed is an organic thin film device, including the first and second organic thin films, and at least one of the first and second organic thin films contains at least one pigment skeleton which is inclined with respect to the lamination direction of the organic thin films.

10 Claims, 3 Drawing Sheets

ORGANIC THIN-FILM DEVICE

BACKGROUND OF THE INVENTION

1. Field of the Invention

The present invention relates to an organic thin-film device, and more particularly to an organic thin-film device which employs a Langmuir Blodgett (LB) film and has a small threshold value of the external potential.

2. Description of the Background Art

A. Aviram et al. of IBM have presented an idea of using molecules comprising tetracyanoquinodimethane (TCNQ) and tetrathiafulvalene (TTF) which are linked with each other by several number of methylene chains, as a rectifier (Chemical Physics Letters, Vol. 29, No. 2, p.277). It, however, in itself is very difficult to synthesize such molecules themselves, and, even if they could by synthesized, it is difficult to orient the TCNQ and TTF in the state that no charge transfer complexes are formed.

Then, a method has been proposed in which donor molecules and acceptor molecules are made into separate solutions and the solutions are successively spread on a liquid surface to form a laminate film by stacking the different monomolecular films according to a Langmuir Blodgett process (hereinafter "LB process"), as disclosed in Japanese Patent Laid-Open Specification No. 62-65477. In recent years, techniques in which thinfilms comprising organic molecules are formed by the LB process have undergone rapid developments, and this has led to increased research into organic thin film devices. These devices exhibit superior performance by controlling a charge transfer between donor molecules and acceptor molecules using external energy such as voltage and light beam. In these devices, however, a reasonably large external energy is required in order to obtain a desired performance, i.e., to normally operate these devices, and the devices have problems in their efficiency, operability, heat generation, durability, etc.

SUMMARY OF THE INVENTION

The present invention has been developed in view of the aforementioned problems of the prior art, and an object of the present invention is to provide an organic thin film device having a small threshold value of an external potential, which is capable of being readily operable in response to a small external energy.

In accordance with one aspect of the present invention, there is provided an organic thin-film device, comprising a first organic thin-film containing an acceptor molecule and a second organic thin-film containing a donor molecule, stacked on the first organic thin-film, at least one of the first and second organic thin films containing a chemical species having a dipole moment $\vec{P}_2$, and the dipole moment $\vec{P}_2$ and a dipole moment $\vec{P}_1$ produced by charge transfer between the acceptor and donor molecules satisfying the following formula:

$$(\vec{P}_1 \cdot \vec{P}_2)|\vec{r}|^2 - 3(\vec{P}_1 \cdot \vec{r})(\vec{P}_2 \cdot \vec{r}) < 0$$

wherein $\vec{r}$ represents a positional relationship between $\vec{P}_1$ and $\vec{P}_2$.

In accordance with another aspect of the present invention, there is provided an organic thin-film device, comprising a first organic thin-film containing an acceptor molecule and a second organic thin-film containing a donor molecule, stacked on the first organic thin-film, at least one of the first and second organic thin-films containing at least one pigment skeleton which is inclined with respect to the lamination direction of the organic thin-films.

DESCRIPTION OF THE PREFERRED EMBODIMENTS

The present invention will now be described in detail with reference to the accompanying drawings.

First, the fundamental concept of the present invention will be described.

In an organic thin film device containing donor and acceptor molecules of the present invention, application of an external energy such as electric field, voltage or light beam results in charge transfer between at least a part of the donor and acceptor molecules inside the organic thin-film. This charge transfer causes a change in absorption spectra or conductivity of the film to bring about positive and negative polarities in the film, resulting in providing functional devices such as display devices, rectifires, switching devices, or light-memory devices.

Such a charge transfer phenomenon between the donor and acceptor molecules of the organic thin-film strongly depends on the structure of, and state of electrons in the organic thin-film. In particular, in a structure in which the organic thin-film containing donor molecules and the organic thin-film containing acceptor molecules are stacked one on another, a threshold value $V_{SH}$ of an external potential which causes a charge transfer can be described in the following formula:

$$V_{SH} = I_P - E_A + U_{DA} + V_{int}$$

Here, $I_P$ represents ionized potential of the donor molecules; $E_A$, electron affinity of the acceptor molecules; $U_{DA}$, Coulomb potential produced when the charge transfer is caused between the donor and acceptor molecules; and $V_{int}$, potential produced by a the mutual action between a donor. molecule/acceptor molecule pairs in which the charge transfer is caused, and other molecules in the organic thin-film. In the above formula, $I_P$ and $E_A$ are specific quantities to the respective molecules, but $U_{DA}$ and $V_{int}$ can be varied by controlling the orientation properties of the molecules. A dipole-dipole interaction V between the donor molecule/acceptor molecule pairs (DA molecule pairs) in which the charge transfer is caused, is represented in the following formula:

$$V(\vec{P}_0, \vec{P}_1) = \sum_n \frac{1}{4\pi\epsilon_1} \left( \frac{\vec{P}_0 \cdot \vec{P}_{1n}}{r_n^3} - \frac{3(\vec{P}_0 \cdot \vec{r}_n)(\vec{P}_{1n} \cdot \vec{r}_n)}{r_n^5} \right)$$

Hence, the threshold value $V_{SH}$ can be described in the following formula:

$$V_{SH} = I_P - E_A + U_{DA} + V(\vec{P^{+-}}, \vec{P^{00}}) - V(\vec{P^{00}}, \vec{P^{00}})$$

Here, $\vec{P^{+-}}$ represents dipole moment of the DA molecule pairs having dipole moment ($\vec{P_1}$) in which the charge transfer is caused; $\vec{P^{00}}$, dipole moment of the chemical species having dipole moment ($\vec{P_2}$) in the reverse direction to that of the DA molecule pairs; and $r_n$, central coordinates (corresponding to distances) of the chemical species having the dipole moment ($\vec{P_2}$) in the reverse direction to the DA molecular pairs.

In the above formula, it is apparent that $V_{SH}$ can be reduced when $\vec{P^{00}}$ has a large component in the reverse direction to $\vec{P^{+-}}$ in the organic thin film. Therefore, in this instance, the charge transfer can be caused by a small threshold value even in a combination of doner molecules and acceptor molecules, where $I_P - E_A$ is large and thus it is supposedly difficult to occur the charge transfer.

In the above formula, in the case where the chemical species having the dipole moment $P_2$ comprises a functional group such as a chromophore bonded to the donor molecule and/or acceptor molecule, $V(\vec{P_0}, \vec{P_1})$ is controlled by the dipole-dipole interaction in the DA molecular pair having a small $r_n$. Assuming that $\vec{P^{00}}$ and $\vec{P^{+-}}$ are related to each other in a positional value or distance $\vec{r}$, $V_{SH}$ is reduced when the following formula is satisfied:

$$(\vec{P^{00}} \cdot \vec{P^{+-}}) |\vec{r}|^2 - 3(\vec{P^{00}} \cdot \vec{r})(\vec{P^{+-}} \cdot \vec{r}) < 0 \quad (I)$$

Therefore, in this instance, the charge transfer can be caused by a small threshold value even in the combination of doner molecules and acceptor molecules, in which because of a large $I_P - E_A$, it is supposedly difficult to happen the charge transfer.

More specifically, when $\vec{P^{00}}$ and $\vec{P^{+-}}$ orient in the reverse direction, $V_{SH}$ is reduced when the following formula is satisfied:

$$-|\vec{P^{+-}}| \, |\vec{P^{00}}| \, |\vec{r}|^2 -$$

$$3|\vec{P^{+-}}| \, |\vec{r}|\cos\theta |\vec{P^{00}}| \, |\vec{r}|\cos(180 - \theta) < 0 -$$

$$1 + 3\cos^2\theta < 0 - \sqrt{3}/3 < \cos\theta < \sqrt{3}/3$$

Figure 3:
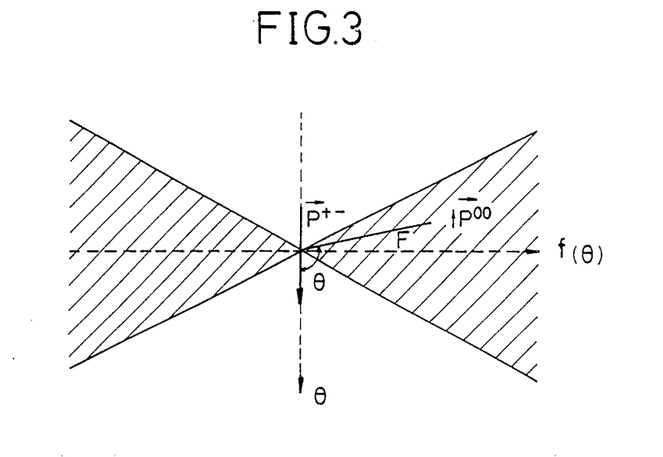
FIG. 3 illustrates the positional relationship between dipole moments $P_1$ and $P_2$ of the present invention.

That is, when $\vec{P^{00}}$ is positioned within the shaded region in FIG. 3 with respect to $\vec{P^{+-}}$, the required conditions of the present invention can be satisfied.

On the other hand, in the case that $\vec{P^{00}}$ and $\vec{P^{+-}}$ orient in the same direction, it is readily understood that, when $\vec{P^{00}}$ is positioned outside the shaded region in FIG. 3 with respect to $\vec{P^{+-}}$, the required conditions of the present invention can be satisfied.

As to $U_{DA}$, it is closely related to the attraction, and hence the threshold value can be decreased by taking the position that increases the absolute value of $U_{DA}$. In general, a pigment molecule used as a donor molecule or acceptor molecule comprises an aromatic group of molecule having a structure in which faces of benzene rings stand in the lamination direction of organic thin-films. Since, it is $\pi$ electrons that contribute $U_{DA}$, when pigment skeletons constituting donor skeletons or acceptor skeletons are inclined with respect to the lamination direction of the organic thin-films, $\vec{r_{DA}}$ becomes smaller, and the overlap of wave functions between the donor molecule and acceptor molecule is increased, thereby enlarging the absolute value of $U_{DA}$.

Figure 6:
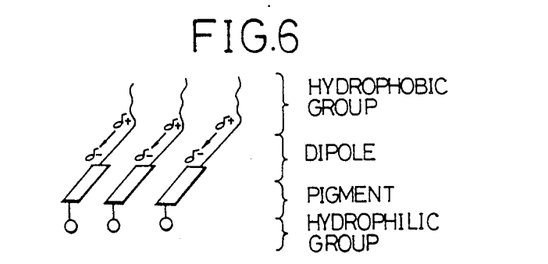
FIGS. 6 and 7 show the inclined orientation of molecules of the device of the present invention.
Figure 7:
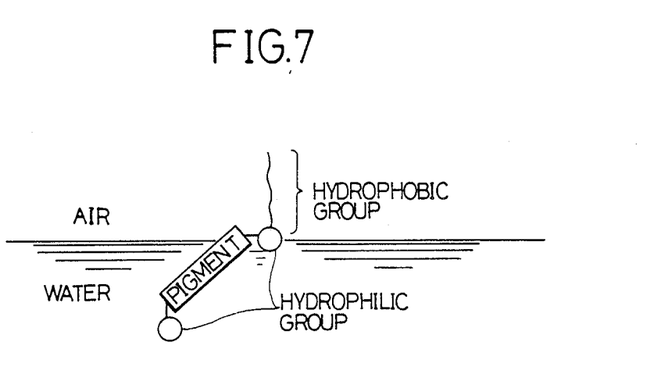

An organic thin-film including such inclined pigment skeletons can be prepared, for example, by using a molecule having a large dipole moment as the donor molecule or acceptor molecule in the LB process. For instance, when the chemical species having the dipole moment is contained in the molecule, the molecule is oriented with inclination so as to cancel the dipole moment even a little, as shown in FIG. 6. Also, when hydrophilic groups are present on both ends of a pigment skeleton, it is highly probable that the pigment skeleton lies on its side on the water surface, as shown in FIG. 7, and hence the organic thin-film including the pigment skeleton having the hydrophilic groups on its ends can be prepared using the LB process while the inclined orientation of the pigment skeleton is kept as it is.

The present invention provides an organic thin-film device, comprising a first organic thin-film containing a donor molecule and a second organic thin-film containing an acceptor molecule, wherein at least any one of the first and second organic thin-films contains a chemical species having a dipole moment $P_2$, and a dipole moment $P_1$ produced by charge transfer between the donor molecule and acceptor molecule satisfies the formula (I).

Some of preferred means of this embodiment are shown below. One of them is the case where the dipole moment $P_2$ is in the reverse direction to the dipole moment $P_1$. Another means is the case where the chemical species having the dipole moment $P_2$ comprises a molecule or a group of atoms bonded to the donor molecule and/or acceptor molecule. Still another means is the case where the first and/or second organic thin-film(s) comprises a mixed film containing a plural species of molecules. A further means is the case where the first organic thin-film and second organic thin-film are alternately laminated in a number of layers to form a super lattice.

The present invention also provides an organic thin-film device, comprising a first organic thin-film containing a donor molecule and a second organic thin film containing an acceptor molecule, wherein the skeleton of a pigment contained in at least any one of the first and second organic thin-films is inclined with respect to the lamination direction of the organic thin-films.

Some of preferred means of this embodiment are shown below. One of them is the case where at least any one of the organic thin-films containing the donor molecule or acceptor molecule contains a chemical species having a dipole moment and at the same time the dipole moment is at least 1 Debye. Another means is the case where the chemical species having the dipole moment comprises a pigment molecule. Still another means is the case where the chemical species comprises a functional group such as a chromophore bonded to the donor molecule or acceptor molecule. A further means is the case where the first organic thin-film and second organic thin film are alternately laminated in a number of layers to form a super lattice. A still further means is the case where hydrophilic groups are present on both ends of a pigment skeleton of a least one of a donor skeleton and an acceptor skeleton.

Examples of the present invention will now be described in detail with reference to the accompanying drawings.

EXAMPLE 1

Figure 1:
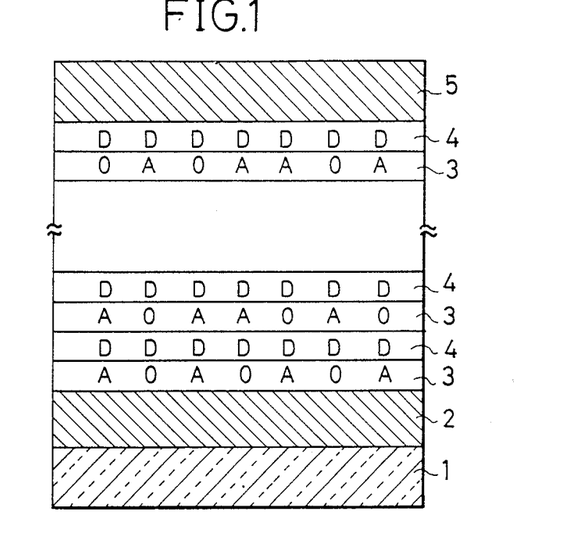
FIG. 1 is a cross section of one embodiment of a display device according to the present invention.

FIG. 1 illustrates one embodiment of an organic thin film device such as a display device according to the present invention. In FIG. 1, on the surface of a glass substrate 1, a transparent electrode 2, e.g., made of a metal oxide is formed. On this electrode 2, a first organic thin-film containing acceptor molecules (acceptor molecular film) 3, and a second organic thin-film containing donor molecules (doner molecular film) 4 are alternately formed to produce a laminate film. Finally, a gold electrode 5 is formed on the top of the laminate film. One example of the fabrication process of this device will be described in detail as follows.

On the surface of a glass substrate 1 of $20 \times 30 \times 2$ mm$^3$, a transparent electrode 2 was formed. Thereafter, this was degreased and washed using successively a neutral detergent, trichlene and acetone, and left as it was. A water tank was filled with an aqueous solution of $10^{-4}$ mol/l of cadmium chloride, and the temperature of the solution was kept at $20° \pm 0.1°$ C. In turn, for a formation of two monomolecular films 3 and 4, 20 mg of TCNQ-C$_{18}$ 20 mg of a nitroaniline alkyl chain derivative and 30 mg of arachidic acid were dissolved in 100 ml of chloroform to prepare a first film solution, and also 50 mg of TTF-2C$_{18}$ and 50 mg of arachidic acid were dissolved in 100 ml of chloroform to prepare a second film solution.

First, 50 μl of the first film solution was spread on the surface of the cadmium chloride solution, and was compressed at a surface pressure of 20 dyn/cm. Then, a mixed monomolecular film 3 of the nitroaniline alkyl chain derivative/TCNQ-C$_{18}$/arachidic acid was transferred onto the transparent electrode 2 (having been subjected to hydrophobic treatment) formed on the substrate 1 by a vertical dip method.

Next, after the mixed monomolecular film remaining on the liquid surface was completely removed by suction, the second film solution was spread on the surface of the cadmium chloride solution, and was compressed at a surface pressure of 20 dyn/cm$^2$. Subsequently a single monomolecular film 4 of TTF-2C$_{18}$ was formed onto the mixed monomolecular film 3 by the vertical dip method. In this case, acceptor skeletons (TCNQ skeletons) A and the skeletons O (nitroaniline skeletons) of the molecules having a dipole moment P$_2$ of the mixed monomolecular film 3 were positioned on the side apart from the transparent electrode 2, and the donor skeletons (TTF skeletons) D of the single monomolecular film 4 were positioned on the side close to the transparent electrode 2. The angle $\theta$ made by P$^{+-}$ and r was 123.9° C.

The above process was repeated to form a laminate film of a super lattice structure as illustrated in FIG. 1. Usually, each of the monomolecular films 3 and 4 is formed in several tens of layers such as 20 to 30 layers, but one layer of each of the monomolecular films 3 and 4 formed is sufficient. The maximum number of the layers of each of the monomolecular films 3 and 4 is about 50, in practice. Then, the substrate with the super lattice structure was left for 5 hours in a dry box packed with silica gel as a drying agent to effect sufficient drying, and thereafter the gold electrode 5 was formed on the super lattice structure. The transparent electrode 2 and gold electrode 5 were connected with gold wires (not shown in FIG. 1) of 0.3 mm as lead wires by using a silver paste to obtain a display device of an organic thin-film device according to the present invention.

Figure 2:
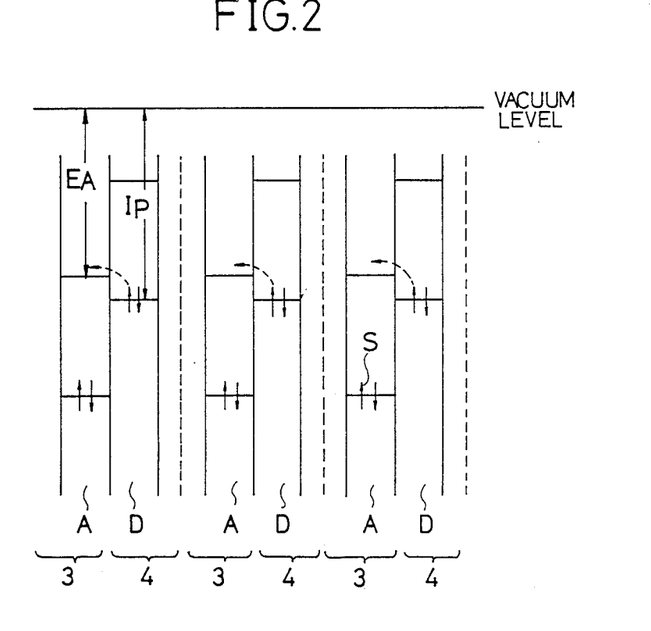
FIG. 2 is a schematic view showing energy bands of the display device in FIG. 1.

FIG. 2 shows an energy band diagram of the super lattice structure portion of the display device thus obtained. In FIG. 2, pairs of arrows with opposite directions indicate electron spins. The ionized potential I$_P$ of the TTF skeleton is sufficiently small, but is slightly larger than the electron affinity E$_A$ of the TCNQ skeleton. Hence, when a bias voltage is applied to the super lattice structure portion with the TTF side as the negative electrode and the TCNQ side as the positive electrode, electrons are transferred from the TTF skeleton to the TCNQ skeleton, as shown by the arrows of broken lines in FIG. 2, with the result of a change in light absorption characteristics in the super lattice structure portion. Therefore, by utilizing this phenomenum, a display operation can be performed in the display device.

Actually, an electric power source was connected to the display devices obtained in the above Example, with the transparent electrode 2 set positive and the gold electrode 5 set negative, and the light beam was irradiated onto the device from an incandescent lamp. As a result, all the display devices exhibited yellow colors when zero voltage was applied, and was turned to exhibit green colors when a 6 V of voltage is applied.

EXAMPLE 2

Another display device according to the present invention was fabricated in the same manner as Example 1, except that was used in place of the nitroaniline alkyl chain derivative. In this instance, $\theta = 123.9°$, and the display action occurred at 5.5 V.

EXAMPLE 3

A further display device according to the present invention was fabricated in the same manner as Example 1, except that was used in place of the nitroaniline alkyl chain derivative. In this case, $\theta = 123.9°$, and the display action occurred at 4 V.

EXAMPLE 4

Still another display device according to the present invention was fabricated in the same manner as Example 1, except that was used in place of the nitroaniline alkyl chain derivative. In this instance, $\theta = 123.9°$, and the display action occurred at 8 V.

COMPARATIVE EXAMPLE 1

A display device was fabricated in the same manner as Example 1, except that a molecular film of the TCNQ-$C_{18}$/the arachidic acid was used as the acceptor molecular film 3 as conventionally done. In this instance, the display action occurred at 15 V.

COMPARATIVE EXAMPLE 2

Another display device was fabricated in the same manner as Example 1, except that a mixed molecular film of the TCNQ-$C_{18}$/the arachidic acid was used as the acceptor molecular film 3, and a mixed molecular film of the TTF-2$C_{18}$/the nitroaniline alkyl chain derivative/the arachidic acid was used as the donor molecular film 4. In this case, the dipole moment of the nitroaniline skeleton is in the same direction as the dipole moment produced by the charge transfer between donor molecules and acceptor molecules, which is different from the above described requirements. The display action occurred at 24 V.

As described above in the Examples and Comparative Examples, in the display devices employing organic thin films, mixing the molecule having dipole moment in the same direction as that of the dipole moment produced by the charge transfer between donor molecules and acceptor molecules enables the display action with a reduced application voltage than ever. In turn, mixing the molecule having dipole moment in the reverse direction to that of the dipole moment produced by the charge transfer between donor molecules and acceptor molecules results in an increased application voltage for the display action and thus worse characteristics. In all Examples, the operation was repeated $10^5$ times, but no change was seen in the characteristics.

In the above Examples, TCNQ-$C_{18}$ is used as the acceptor molecule, TTF-2$C_{18}$ as the donor molecule, and as the molecule having a large dipole moment. Further, the threshold value can also be varied by appropriately selecting these molecules. Also, using at least plural kinds of the donor molecules or acceptor molecules makes it possible to constitute a multi-color display device capable of stepwise changing colors as the applied potential increases. The molecule having a large dipole moment may also be used in plural kinds.

EXAMPLE 5

Figure 4:
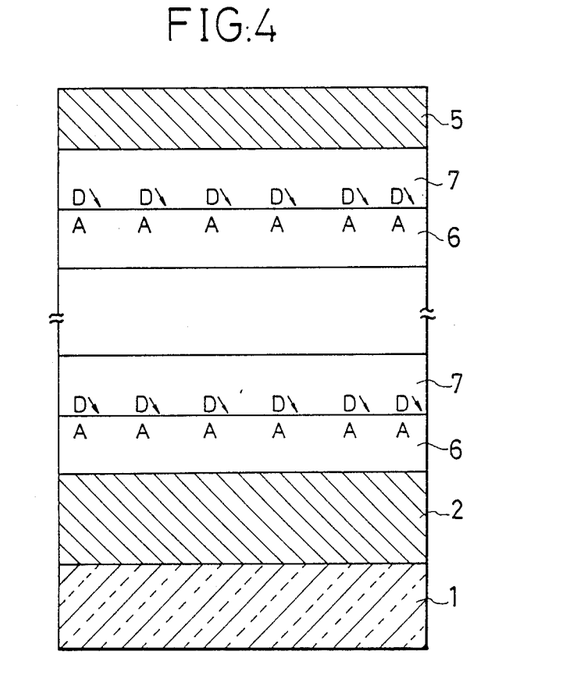
FIG. 4 is a cross section of another embodiment of a display device according to the present invention.

FIG. 4 illustrates another embodiment of an organic thin-film device such as a display device according to the present invention, having the same construction as the one shown in FIG. 1, except that a first organic thin-film containing acceptor molecules (acceptor molecular films) 6, a second organic thin film containing donor molecules (donor molecular films) 7 are alternately formed to produce a laminate film, and the doner skeletons of the doner molecular films 7 are inclined at a certain degree with respect to the lamination direction of the films 6 and 7. One example of the fabrication process of this device will be described in detail. This process is similar to the one described in Example 1, and thus the same operations or steps as those in Example 1 can be omitted for the brevity of the description.

A transparent electrode 2 was formed on the surface of a glass substrate 1, and was degreased and washed, and a cadmium chloride solution was prepared in the same manner as Example 1. For a formation of two monomolecular films 6 and 7, 50 mg of QI-$C_{18}$ and 50 mg of arachidic acid were dissolved in 100 ml of chloroform to prepare a first film solution, and also 50 mg of PDME-2$C_{18}$ was dissolved in 100 ml of toluene to prepare a second film solution.

First, the first film solution was spread on the surface of the cadmium chloride solution, and a monomolecular film 6 of QI-2$C_{18}$ was transferred on the transparent electrode 2 in the same manner as Example 1. Next, the second film solution was spread on the surface of the cadmium chloride solution, and a monomolecular film 7 of PDME- 2$C_{18}$ was formed onto the monomolecular film 6 in the same manner as Example 1. In this instance, acceptor skeletons (QI skeletons) A of the monomolecular film 6 were positioned on the side apart from the transparent electrode 2, and the doner skeletons (paraphenylenediamine skeletons) D of the monomolecular film 7 were positioned on the side close to the transparent electrode 2. The groups having a dipole moment in the donor skeletons D were so arranged that the hydrophilic groups were present on both ends thereof.

The above process was repeated to form a laminate film of a super lattice structure, as illustrated in FIG. 4. Then, the substrate was dried, and a gold electrode 5 was formed in the same manner as Example 1 to obtain a display device of the present invention.

The light beam was irradiated onto the display devices obtained in the above Example in the same manner as Example 1, and all display devices exhibited yellow colors when the zero voltage was applied, and turned to exhibit blue colors when a 5 V of voltage was applied.

Figure 5:
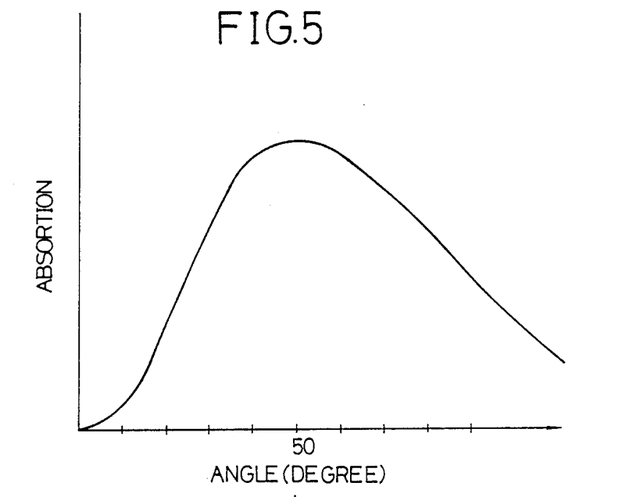
FIG. 5 shows a performance of the device of the present invention.

As to the orientation of PDME-2$C_{18}$, an angle dependence of absorption of the device was examined by applying the light having a wavelength of around 2,600 angstroms and a polarization of 90 degree, to the device while changing the incident angle. Results obtained are shown in FIG. 5, where the absorption reaches a maximum when the incident angle is 50 degree from the substrate. This reveals that the paraphenylenediamine skeletons face to the direction inclined by 50 degree from the lamination direction of the organic thin-films.

EXAMPLE 6

Another display device according to the present invention was fabricated in the same manner as Example 5, except that PD-2$C_{18}$ was used in place of PDME-2$C_{18}$. In this case, the doner skeletones (paraphenylenediamine skeletons) are inclined from the lamination direction. The inclination of the paraphenylenediamine skeletons from the lamination direction was 55 degree, and the display action occurred at 4.5 V.

COMPARATIVE EXAMPLE 3

A display device was fabricated in the same manner as Example 5, except that was used in place of PDME-2$C_{18}$ as conventionally done. In this instance, the display action occurred at 14 V, and the direction of the paraphenylenediamine skeletons was approximately the same as that of the lamination direction.

EXAMPLE 7

Another display device according to the present invention was fabricated in the same manner as Example 1, except first and second monomolecular films. For the formation of the first and second monomolecular films 3 and 4, 50 mg of TCNQ-$C_{18}$ and 50 mg of arachidic acid were dissolved in 100 ml of chloroform to prepare a first film solution, and also 50 mg of PD-2$C_{18}$ was dissolved in 100 ml of toluene to prepare a second film solution. First, a first monomolecular film 3 of TCNQ-$C_{18}$ was transferred on the transparent electrode 2, and then a second monomolecular film 4 of PD-2$C_{18}$ was formed on the first monomolecular film 3 in the same manner as described above. The above process was repeated to form a laminate film of a super lattice structure, as shown in FIG. 4.

In this instance, the groups having a dipole moment are arranged so as to satisfy the formula (I) described above, and the paraphenylenediamine skeletons of PD-2$C_{18}$ are inclined from the lamination direction of the organic thin-films.

In this case, all the display devices obtained exhibited yellow colors when the zero voltage was applied, and turned to exhibit blue colors when a 4.5 V of voltage was applied. The paraphenylenediamine skeletons are inclined by 50 degree from the lamination direction of the organic thin-films.

EXAMPLE 8

Another display device according to the present invention was fabricated in the same manner as Example 7, except that was used in place of TCNQ-C$_{18}$. In this instance, the display action occurred at 3.0 V. Also, the inclination of the paraphenylenediamine skeletons from the lamination direction was 50 degree, same as Example 7.

EXAMPLE 9

Another display device according to the present invention was fabricated in the same manner as Example 7, except that was used in place of TCNQ-C$_{18}$. In this case, $\theta=0$, and the display action occurred at 3.0 V.

COMPARATIVE EXAMPLE 4

A display device was fabricated in the same manner as Example 7, except that was used in place of PD-2C$_{18}$ as conventionally done. In this instance, the display action occurred at 13 V, and the direction of the paraphenylenediamine skeletons was approximately the same as the lamination direction.

COMPARATIVE EXAMPLE 5

Another display device was fabricated in the same manner as Example 7, except that was used in place of PD-2C$_{18}$. In this instance, the group having a dipole moment does not satisfy the above formula (I). In this instance, the display action occurred at 18 V.

As described above in the Examples and Comparative Examples, in the display devices employing organic thin films, the display action with a reduced application voltage than ever can be performed when at least any one of the acceptor molecules and donor molecules includes a group having a large dipole moment, and its position satisfies the above formula (I), or the pigment skeletons are inclined with respect to the lamination direction of the organic thin-films. When the position of the group having a dipole moment does not satisfy the above described requirements of the present invention, the display action occurs at a further higher voltage than a molecule including no group having a dipole moment, resulting in worse characteristics. In all Examples, the operation was repeated 10$^5$ times, but no change was seen in the characteristics.

In the above Examples, the following three combinations of the donor and acceptor molecules have been used:

PD-2C$_{18}$/TCNQ-C$_{18}$,

Further, the threshold value can also be varied by appropriately selecting these molecules. Also, using at least plural kinds of the doner molecules or acceptor molecules makes it possible to constitute a multi-color display device capable of stepwise changing colors as the applied potential increases. The molecule having a large dipole moment may also be used in plural kinds.

First, in addition to the above described molecules for forming the doner molecule film as the first organic thin film in the present invention, the following molecules may be also used.

(1) Fulvalen doners having the structure as follows:

TTF
IMTTF
DBTTF
HMTTF
BEDT-TTF
TSF
TMTSF
HMTSF
HMTTeF

(2) Sulfur-containing heterocyclic donors having the structure as follows:

Tetrathiatetracene (TTT)

Tetraselenatetracene (TST)

-continued

Tetrathionaphthalene

Tetrathioperillene

Tetraphenylbithia-pyralidene (BIP)

Benzothiophene (BBT)

Here, φ represents a phenyl group.

(3) Amine donors having the structure as follows:

(4) Metal compound donors having the structure as follows:

M(dpq)₂

Rd(bpy)₃

MNT

(5) Cyanine pigment donors having the structure as follows:

(6) Nitrogen-containing heterocyclic donors having the structure as follows:

Phenothiazine

Phenazine

Quinoline

Acrydine

DEPE²⁺

(7) Polymer donors having the structure as follows:

Polyacetylene

Polypyrrole
X = O, N, S

Polypyridine

Poly(p-phenylene)

Poly(p-phenylene sulfide)

The donor molecules shown in (1) to (7) may be in the form as shown by the structural formula; or in the form of derivatives including any of them as a skeleton and having a hydrophobic group including $CH_3(CH_2)_n$ or $CH_3(CH_2)_p(CH=CH)_q(CH_2)_l$ (n and p+q+l are each 8 or more), or a hydrophobic group including a cholestene skeleton, cholestane skeleton or cholane skeleton; derivatives having a hydrophilic group including —COOH, —OH, —SO$_3$H, —COOR', —NH$_2$, —N$^+$(R')$_3$Y$^-$ (Y is halogen); or derivatives having together these hydrophobic group and hydrophilic group.

Second, in addition to the above described molecules for forming the acceptor molecule film as the second organic thin-film in the present invention, the following molecules may be also used.

(8) Cyano compound acceptors having the structure as follows:

TCNQ

Me$_2$ TCNQ

TCNDQ

TNAP

TCNE

HCB

DTF

Dicyanobenzene (DCNB)

(9) Quinone acceptors having the structure as follows:

Dicyanonaphthoquinone

DDQ

-continued

Chloranil

Benzoquinone

2,5-Dimethylbenzoquinone

Naphthoquinone

2,6-Dichlorobenzoquinone

2,3-Dichloronaphthoquinone

(10) Nitro compound acceptors having the structure as follows:

p-Noitrocyanobenzene

1,3-Dinitrobenzene

TNF

1,3,5-Trinitrobenzene p-Nitrobenzene (11) Quinonediimine acceptors having the structure as follows:

(12) Quinoneimine acceptors having the structure as follows:

-continued

The acceptor molecules shown in (8) to (12) may be in the form as shown by the structural formula; or in the form of derivatives including any of them as a skeleton and having a hydrophobic group including $CH_3(CH_2)_n$ or $CH_3(CH_2)_p(CH=CH)_q(CH_2)_l$ (n and p+q+l are each 8 or more), or a hydrophobic group including a cholestene skeleton, cholestane skeleton or cholane skeleton; derivatives having a hydrophilic group including —COOH, —OH, —SO$_3$H, —COOR′, —NH$_2$, —N$^+$(R′)$_3$Y$^-$ (Y is halogen); or derivatives having together these hydrophobic group and hydrophilic group.

Then, in the donor molecule film or acceptor molecule film of the present invention, the following molecules are used as an insulating molecule to be mixed with the doner molecule and/or acceptor molecule, or an insulating molecule to be used in an insulating molecule film.

(13) Saturated or unsaturated hydrocarbon derivatives represented by the following general formula:

R—X wherein R represents a replaceable hydrophobic group including $CH_3(CH_2)_n$ or $CH_3(CH_2)_p(CH=CH)_q(CH_2)_l$ (n and p+q+l are each 8 or more), and X represents a hydrophilic group including —COOH, —OH, —SO$_3$H, —COOR′, —NH$_2$, —N$^+$(R′)$_3$Y$^-$ (Y is halogen).

(14) Various polymerizable molecules:

As exemplified by replaceable vinyl polymers of acrylate, methacrylate, vinyl ether, styrene, vinyl alcohol, acrylamide and acrylate; α-amino acids such as alanine, glutamate and aspertate, and amino acids other than the α-amino acids, such as ε-aminocaproic acid; and polyamide polymers including a 1:1 mixture of a diamine such as hexamethylenediamine with a dicarboxylic acid such as hexamethylenedicarboxylic acid.

These molecules may be used alone when they can be polimerizable by themselves to form a film. Molecules that can not form a film alone may be used by mixing with the insulating molecules capable of forming a film alone, as described in (11).

The chemical species having the dipole moment P$_2$ for use in the present invention is represented by general formula (II):

$$A—M—D \tag{II}$$

wherein A represents an electron-attractive substituent such as a nitro group, a cyano group, a carbonyl group or a sulfonyl group; D represents an electron-donative substituent such as an amino group, an alkoxy group or a hydroxyl group; and M represents a conjugated hydrocarbon skeleton.

In Formula (II), the more distant A and D are from each other, the larger the dipole moment and the greater degree of coloring will be. Accordingly, an appropriate selection of molecules is required for producing the display devices.

Examples of molecules represented by Formula (II) are shown in the following. The dipole moment of these molecules orients in the left direction.

-continued

The molecule having the dipole moment may be in the form as shown by the structural formula; or in the form of derivatives including any of them as a skeleton and having a hydrophobic group including $CH_3(CH_2)_n$ or $CH_3(CH_2)_p(CH=CH)_q(CH_2)_l$ (n and p+q+l are each 8 or more), or a hydrophobic group including a cholestene skeleton, cholestane skeleton or cholane skeleton; derivatives having a hydrophilic group including —COOH, —OH, —SO$_3$H, —COOR', —NH$_2$, —N+(R')$_3$Y$^{31}$ (Y is halogen); or derivatives having together these hydrophobic group and hydrophilic group.

As described above, it is readily understood that according to the present invention, there is provided an organic thin film-device having a small threshold value of the external potential, which is capable of being readily operable in response to a small external energy.

Although the present invention has been described in its preferred embodiments with reference to the accompanying drawings, it is readily understood that the present invention is not restricted to the preferred embodiments thereof and that various changes and modifications may be made in the present invention by one skilled in the art without departing from the spirit and scope of the present invention

What is claimed is:

1. An organic thin-film device for use in functional devices of display device, rectifiers, switching devices and light-memory devices, comprising:
a first organic thin-film including an acceptor molecule; and
a second organic thin-film including a donor molecule, stacked on the first organic thin-film, a dipole moment $\vec{P_1}$ with a center being produced by charge transfer between the acceptor and donor molecules, at least one of the first and second organic thin-films including a chemical species having a dipole moment $\vec{P_2}$ with a center, and the dipole moment $\vec{P_2}$ and a dipole moment $\vec{P_1}$ produced by charge transfer between the acceptor and donor molecules satisfying the following formula:

$$(\vec{P_1}\cdot\vec{P_2})|\vec{r}|^2 - 3(\vec{P_1}\cdot\vec{r})(\vec{P_2}\cdot\vec{r}) < 0$$

wherein $\vec{r}$ represents a vector directing from the center of the dipole moment $\vec{P_2}$ to the center of the dipole moment $\vec{P_1}$, the chemical species including a structure represented by the formula A—M—D, wherein M is a conjugated hydrocarbon skeleton; A is an electron-attractive substituent of one of a nitro group, a cyano group, a carbonyl group and a sulfonyl group; and D is an electron-donative substituent of one of an amino group, an alkoxy group and a hydroxy group.

2. The organic thin film device of claim 1, wherein the direction of the dipole moment $\vec{P_2}$ is opposite to that of the dipole moment $\vec{P_1}$.

3. The organic thin film device of claim 1, wherein one of the first and second organic thin films includes plural species of molecules.

4. The organic thin film device of claim 1, wherein the first and second organic thin films are alternately stacked one on another to produce a laminate film having super lattice structure.

5. The organic thin film device as claimed in claim 1, wherein the chemical species includes at least one pigment skeleton which is inclined with respect to the stacking direction of the organic thin-films.

6. The organic thin film device of claim 5, wherein the acceptor and doner molecules include acceptor and doner skeletons, respectively, and hydrophilic groups are present on both ends of at least one of the acceptor and doner skeletons.

7. The organic thin film device of claim 1, wherein the chemical species is selected from the group consisting of:

8. The organic thin film device of claim 1, wherein the chemical species comprises a hydrophobic group selected from the group consisting of a cholestene skeleton, a cholestane skeleton, a cholane skeleton $CH_3(CH_2)_n$, and $CH_3(CH_2)_p(CH=CH)_q(CH_2)_l$, where n and p+q+l equal at least 8.

9. The organic thin film device of claim 1, wherein the chemical species comprises a hydrophilic group selected from the group consisting of a —COOH, —OH, —SO₃H, —COOR', —NH₂ and —N+(R')₃Y⁻ where Y is halogen.

10. The organic thin film device of claim 8, wherein the chemical species comprises a hydrophilic group selected from the group consisting of a —COOH, —OH, —SO₃H, —COOR', —NH₂ and —N+(R')₃Y⁻ where Y is halogen.

* * * * *